United States Patent
Boitnott et al.

(10) Patent No.: US 8,920,613 B2
(45) Date of Patent: Dec. 30, 2014

(54) OFFSET MAGNET COMPENSATION FOR NON-UNIFORM PLASMA

(75) Inventors: Christopher Boitnott, Half Moon Bay, CA (US); Keith A. Miller, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 2451 days.

(21) Appl. No.: 11/669,763

(22) Filed: Jan. 31, 2007

(65) Prior Publication Data
US 2008/0179183 A1    Jul. 31, 2008

(51) Int. Cl.
*C23C 14/34* (2006.01)
*C23C 14/35* (2006.01)
*C23C 14/04* (2006.01)
*H01J 37/34* (2006.01)

(52) U.S. Cl.
CPC .............. *C23C 14/35* (2013.01); *C23C 14/046* (2013.01); *H01J 37/3408* (2013.01); *H01J 37/3452* (2013.01); *H01J 37/3458* (2013.01)
USPC ............. 204/192.3; 204/298.16; 204/298.06; 204/192.12; 118/723 E; 118/723 I; 156/345.43

(58) Field of Classification Search
USPC ............... 204/298.01, 298.16, 298.06, 192.3, 204/192.12; 335/213, 299, 300; 336/199; 156/345.43; 118/723 E, 723 I
See application file for complete search history.

(56) References Cited

U.S. PATENT DOCUMENTS

| | | | |
|---|---|---|---|
| 4,211,992 A * | 7/1980 | Gaskill, Jr. | 335/222 |
| 4,885,070 A * | 12/1989 | Campbell et al. | 204/298.06 |
| 4,894,510 A | 1/1990 | Nakanishi et al. | |
| 2005/0199491 A1* | 9/2005 | Gung et al. | 204/298.11 |
| 2005/0263390 A1 | 12/2005 | Gung et al. | 204/192.15 |
| 2006/0030151 A1 | 2/2006 | Ding et al. | |
| 2006/0169582 A1 | 8/2006 | Brown et al. | |

FOREIGN PATENT DOCUMENTS

JP    04012509 A  *  1/1992

OTHER PUBLICATIONS

International Search Report—PCT/US 08/00793 May 5, 2008.

* cited by examiner

*Primary Examiner* — John Brayton
(74) *Attorney, Agent, or Firm* — Charles S. Guenzer

(57) ABSTRACT

A non-axisymmetric electromagnet coil used in plasma processing in which at least one electromagnet coil is not symmetric with the central axis of the plasma processing chamber with which it is used but is symmetric with an axis offset from the central axis. When placed radially outside of an RF coil, it may reduce the azimuthal asymmetry in the plasma produced by the RF coil. Axisymmetric magnet arrays may include additional axisymmetric electromagnet coils. One axisymmetric coil is advantageously placed radially inside of the non-axisymmetric coil to carry opposed currents. The multiple electromagnet coils may be embedded in a molded encapsulant having a central bore about a central axis providing the axisymmetry of the coils.

16 Claims, 5 Drawing Sheets

OFFSET MAGNET COMPENSATION FOR NON-UNIFORM PLASMA

FIELD OF THE INVENTION

The invention relates generally to sputtering of materials in the fabrication of integrated circuits. In particular, the invention relates to the auxiliary magnets in a plasma processing chamber.

BACKGROUND ART

Sputtering, alternatively called physical vapor deposition (PVD), has long been used for the deposition of metals such as aluminum to form horizontal interconnects in a semiconductor integrated circuit. More recently it has been adapted to deposit thin liner layers in high aspect-ratio via holes used to form vertical interconnects between metallization layers in the integrated circuit. Examples of liner layers include barrier layers such as of titanium and tantalum and their nitrides and copper seed layers subsequently used in filling the via holes with copper by electrochemical plating (ECP).

DC magnetron sputtering is the preferred sputtering method in commercial fabrication. It has been adapted to sputtering into high aspect-ratio via holes by increasing the fraction of sputter metal atoms that are ionized and by electrically biasing the wafer so that the ions are accelerated towards the wafer at high energy and penetrate deep within the via hole.

Even more recently, it has been found that a plasma sputter chamber can be used to sputter etch the wafer, also called resputtering, so that the same sputter chamber can be used in a multi-step process to both sputter deposit material onto the wafer and to remove material from the wafer. The geometry associated with high aspect-ratio via holes allows the two steps to be controlled such that on net material is deposited on only some portions of the via hole. This selective deposition is particularly useful in depositing a metal nitride barrier layer, which is somewhat resistive, onto the sidewalls of the via hole but not depositing it on the bottom of the via hole so that the underlying lower-level metallization can be directly contacted by the vertical metallization.

A conventional DC magnetron sputter chamber includes a metallic target, for example, having at least a surface layer composed of tantalum or copper, which is selectively negatively biased with respect to the chamber sidewalls or protective sidewall shields so that a sputter working gas of argon is discharged into a plasma. The magnetron placed in back of the target projects a magnetic field to the other face of the target to concentrate the plasma adjacent the sputtering surface of the target. The argon ions are energetically attracted to the target and sputter metal atoms from it, some which strike the opposed wafer and deposit a metal layer on it. Such a sputter chamber can be adapted to perform sputter etching of the wafer, for example, by including an RF coil around the space between the target and the wafer to inductively coupled RF power into the chamber. In the sputter deposition phase, the RF coil is typically not significantly powered. However, in the sputter etch phase, the RF coil is powered while the DC power applied to the target is significantly reduced. The RF coil inductively couples RF energy into the chamber to excite argon into a plasma in the space above the wafer. The electrical bias applied to the wafer, which is typically a negative DC bias induced by another RF source, energetically attracts the argon ions to the wafer so that they preferentially etch horizontal surfaces, in particular the bottom of the via holes, while not significantly etching the via sidewalls.

A typical configuration of the RF coil system is schematically illustrated in FIG. 1. An RF coil 10 is positioned inside the sidewall sputter shields coaxial with the chamber's central axis 12. For economic and operational reasons, it is typically formed as a single-turn coil in a plane perpendicular to the central axis 12 wrapped generally symmetrically about the central axis 12 but having a junction 14 with two electrical leads to an external biasing circuit. The junction 14 creates an azimuthal gap in the RF coil of less than 15° although the location of the electrical contacts increase the effective gap to about 18°. Two coupling capacitors 16, 18 electrically couple the RF coil 10 between an RF power source 20 and ground. Additionally, a matching circuit 22 matches the 50 ohm coaxial cable from the RF source 20 to the impedance of a plasma 24 excited from the argon gas inside the coil 10. The argon ions from the plasma 24 are attracted towards the negatively biased wafer to sputter etch it.

It has been found that the plasma 24 tends to diffuse to the grounded shields or chamber sidewalls so that the radial distribution of argon ion striking the wafer is stronger at the wafer center than at the wafer edge. Accordingly, it is known to position a DC electromagnetic coil outside the chamber and coaxial with the central axis 12 to create a magnetic barrier to the diffusing plasma, specifically the plasma electrons but the plasma ions substantially redistribute themselves to neutralize the plasma ions. The charged plasma particles interact with the magnetic field B according to the Lorentz force $$F = qv \times B,$$

where q is the charge of the plasma particle, v is the particle's vector velocity, and F is the Lorentz force exerted on the charged particle by the magnetic field B. The Lorentz force F deflects the charged particle transversely to its velocity v. The radius of curvature r of the deflection is related as $$\frac{mv^2}{r} = qv \times B,$$

where m is the mass of the charged particle. In the limit of a charged particle trapped in a uniform magnetic field, the radius r becomes the cyclotron radius. A magnetic field B extending parallel to the central axis near the sidewalls of the chamber deflects the charged particles, particularly the lighter electrons, diffusing outward from the central axis back towards the central axis. To maintain charge neutrality inside the plasma, the charged ions follow the electrons and thus are also effectively deflected back towards the center. Gung et al. discloses a more complicated magnet array in U.S. patent application Ser. No. 11/119,350, filed Apr. 29, 2005, incorporated herein by reference and published as U.S. patent application publication 2005/0263390. Their magnet array includes two pairs of coaxial electromagnet coils, in which each pair includes coils at a same height but different radii from the chamber center.

While these electromagnet arrays have been effective at producing a more radially uniform sputter etch, further investigation has revealed that the etch rate is also azimuthally non-uniform and the magnitude of the azimuthal asymmetry nears that of the reduced radial asymmetry enabled by the electromagnet coils. That is, despite the apparent geometric symmetry about the central axis including the time-averaged rotated magnetron, the etch rate has been observed to significantly vary in the azimuthal or circumferential direction. It is greatly desired to reduce the azimuthal non-uniformity for the increasingly more stringent uniformity requirements imposed by advanced integrated circuits.

SUMMARY OF THE INVENTION

An electromagnet coil used in plasma processing chamber is asymmetric with respect to the chamber's central axis, for example, it is symmetric about an offset axis offset from the central axis. The asymmetric electromagnet coil is particularly useful when placed radially outside of an RF coil used to induce a plasma in the chamber. The asymmetric electromagnet coil may be used to compensate for azimuthal asymmetries otherwise produced in the plasma by the RF coil.

Advantageously, the asymmetric electromagnet coil is paired with a symmetric electromagnet coil with the electromagnet coils and preferably the RF coil disposed in a same plane perpendicular to the chamber axis. Thereby, the separation between the two coils varies azimuthally. When approximately equal but opposite currents are passed through the two coils, positions of larger separation between the coil manifest a stronger magnetic barrier against the diffusion of the plasma to the chamber sidewalls.

Additional symmetric electromagnet coils may be positioned at different axial positions along the chamber sidewalls.

All the electromagnet coils may be embedded in an encapsulant to form a unitary structure having a central bore with cylindrical sidewalls that fit on the outside of the chamber sidewalls. The central bore and its sidewalls are symmetric about a central axis and the embedded symmetric electromagnet coils are wound about the central axis but the asymmetric electromagnet coil is wound about an axis offset from the central axis.

The asymmetric coil is particularly useful in compensating for azimuthal non-uniformity of the sputter etch rate in the workpiece substrate when the RF coil is powered to excite an argon working gas into a plasma, which is used to sputter etch the substrate.

The asymmetric coil is advantageously used in two-step process in a plasma sputter chamber. In a first, sputter deposition step, the target is powered to create a plasma to sputter target material onto the substrate. The asymmetric coil is not significantly powered in the first step. In a second, sputter etch step, a sputter working gas is excited into a plasma, for example, by an RF inductive coil but the target is not significantly powered, resulting in little if any target sputtering. Instead the ionized working gas is attracted to the electrically biased substrate to sputter etch it with an anisotropic flux of energetic but chemically inactive working gas ions. In the second step, the asymmetric coil is powered to create an asymmetric magnetic field distribution in the chamber to compensate for azimuthal asymmetric introduced into the plasma by the RF coil.

A combined sputter deposition and sputter etch may be performed by strongly powering the target and powering the RF coil. The asymmetric electromagnet coil is powered to compensate for the asymmetries produced by the RF coil

DETAILED DESCRIPTION OF THE PREFERRED EMBODIMENTS

Figure 2:
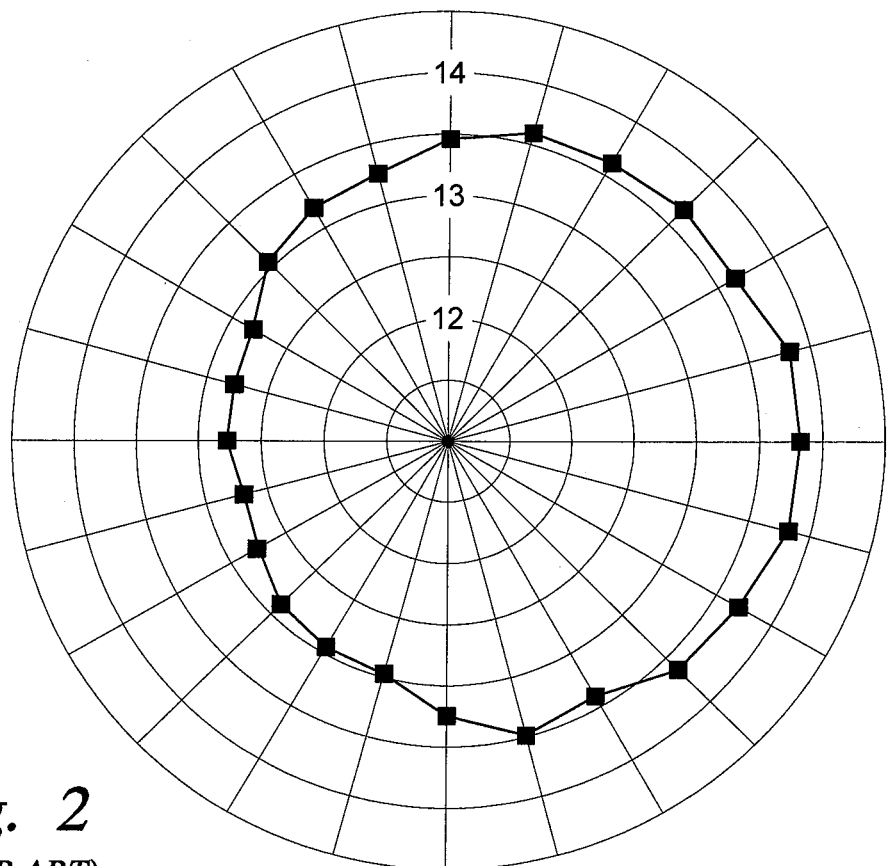
FIG. 2 is a graph illustrating the azimuthal etch asymmetry often observed with coaxial electromagnets.

Azimuthal etch uniformity was measured in a number of sputter chambers using coaxial RF coils and auxiliary magnets. The sputter etch depth for an argon sputter etch was measured in a band near the outer periphery of the wafer. A typical result is illustrated in the graph of FIG. 2, in which the radius from the center quantizes the etch depth in nanometers and the azimuthal angle corresponds to that of the wafer being tested. Although there is some variation between chambers, they all show approximately the same azimuthal dependence with a azimuthal non-uniformity of 10% or greater in the etch rate. Importantly, they all show the lowest etch rate occurs approximately near the junction of the RF coil although the precise angular locations of the minimum and maximum etch rates vary somewhat from chamber to chamber for reasons that are not fully understood.

Figure 1:
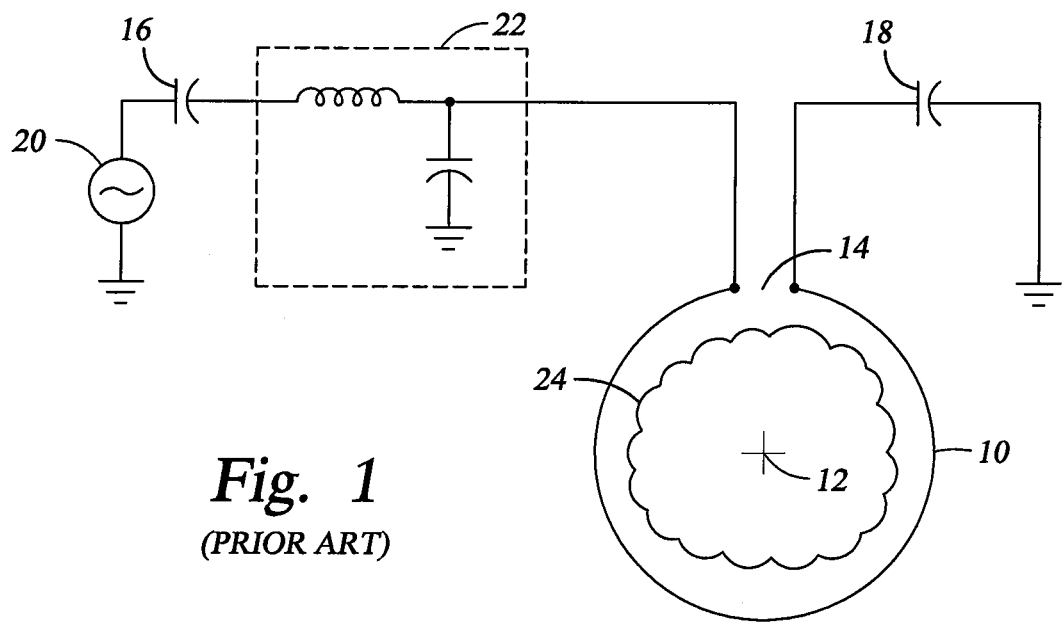
FIG. 1 is a schematic representation of auxiliary inductive coil used in a plasma sputter chamber to enhance sputter etching of the wafer.

The azimuthal asymmetry is believed to be partly due to the small gap in the coil RF 10 at the junction 14 for its electrical leads, but the size of the non-uniformity is too large and its shape is inconsistent with the relatively small coil gap causing all the non-uniformity. We believe that the azimuthal non-uniformity arises in large part from an electromagnetic standing wave at the RF frequency which seems to be inevitably set up in the electrical circuit of FIG. 1. Although the wavelength of the RF signal at 13.56 MHz is larger than dimensions of the chamber, nonetheless for 300 mm chambers the amount of the RF power coupled into the chamber is bound to vary at different azimuthal portions of the RF coil 10 because the magnitude of the RF standing wave varies around the coil 10. The azimuthal variation in induced RF power causes the density of the plasma to correspondingly vary azimuthally. It is somewhat possible to tune the location of the maximum power transfer by adjusting the external biasing and coupling circuitry, but some azimuthal variation in the induced RF power is expected to always occur. Such external tuning has been found to be only partially effective at reducing the non-uniformity.

Figure 3:
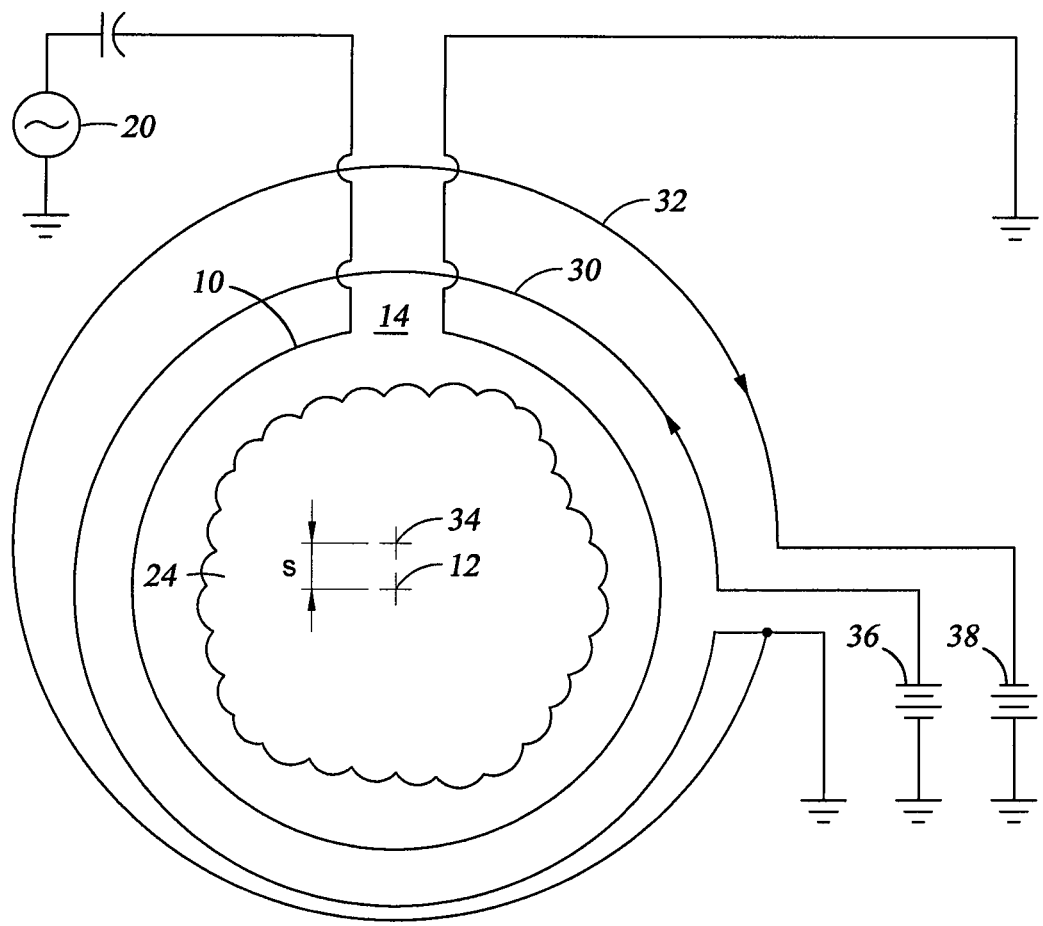
FIG. 3 is a schematic diagram illustrating offset magnetic coils in combination with an inductive coil.

One embodiment of the invention, illustrated schematically in FIG. 3, includes an inner electromagnet coil 30 symmetric about the chamber's central axis 12 and an outer electromagnet coil 32, located radially outwardly from the inner electromagnet coil 30 but symmetric about a offset axis 34 offset from the central axis 12 by a distance s. Both electromagnet coils 30, 32 are located radially outside of the RF coil 10, which is shown with a simplified RF biasing circuitry. Although illustrated as single-turn loops, the electromagnet coils 30, 32 typically each include multiple turns of magnet wire. If the two electromagnet coils 30, 32 have respective radii of $r_1$ and $r_2$, the separation between the two coils 30, 32 varies azimuthally between $(r_2-r_1+s)$ and $(r_2-r_1-s)$. DC power supplies 36, 38 supply DC current to the respective electromagnet coils 30, 32. In the usual configuration, the currents in the two electromagnet coils 30, 32 run in opposed directions so they set up generally opposing magnetic fields but the cancellation decreases with increasing size of the separation between the two electromagnet coils 30, 32.

Substantially similar results can be obtained with the outer coil 32 being symmetric about the central axis 12 and the inner coil 30 being offset and symmetric about the offset axis 34. That is, in this variant, the non-axisymmetric coil is inside of the axisymmetric coil and in the same plane.

Figure 4:
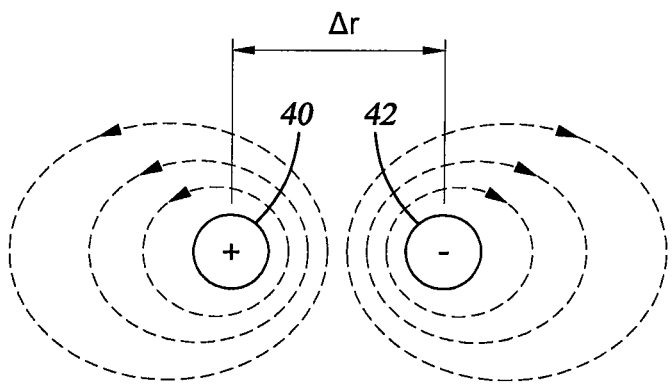
FIG. 4 is a cross-sectional view of the magnetic field produced by two parallel conductors carrying opposed currents.

As illustrated schematically in FIG. 4, two electromagnet coils may be approximated by two parallel conductors 40, 42 separated by a distance $\Delta r$. If the conductors 40, 42 carry currents of the same magnitude but opposite polarity, they each produce the same curled magnetic field distribution but with opposite curl direction. Together, they produce a total magnetic field distribution which is strong in the gap between the conductors 40, 42 but falls off relatively quickly away from the conductors 40, 42, particularly in the plane of the conductors 40, 42. In and near the plane, the magnetic field is vertical or nearly so and creates a magnetic barrier, both between the conductors 40, 42 and outside of them. If the conductors 40, 42 are relatively close to each other, $\Delta r \cong 0$, the intensity of the magnetic field falls off relatively rapidly away from the conductors 40, 42 because the two contributions tend to cancel each other and the local magnetic field intensity is relatively small. However, if the separation $\Delta r$ between the conductors 40, 42 is larger, the fall off is not so rapid and the local magnetic field intensity is larger. Thus, varying the separation $\Delta r$ also varies the magnetic field intensity at a given distance from the pair of conductors.

In the configuration of FIG. 3, the closeness of the electromagnet coils 30, 32 at the bottom, 6 o'clock position produces a relatively weak magnetic barrier in the vicinity of the RF coil 10 while the greater separation of the electromagnet coils 30, 32 at the upper, 12 o'clock position produces a stronger magnetic barrier near the RF coil junction 14. The stronger magnetic barrier reduces the plasma diffusion to the chamber walls near the coil junction 14 and hence increases the edge sputter etching rate at that angular position.

Although it is advantageous to partially balance opposing axisymmetric and non-axisymmetric magnetic fields created by electromagnetic coils in the same plane, many of the same results can be obtained with a single non-axisymmetric electromagnetic coil.

Figure 5:
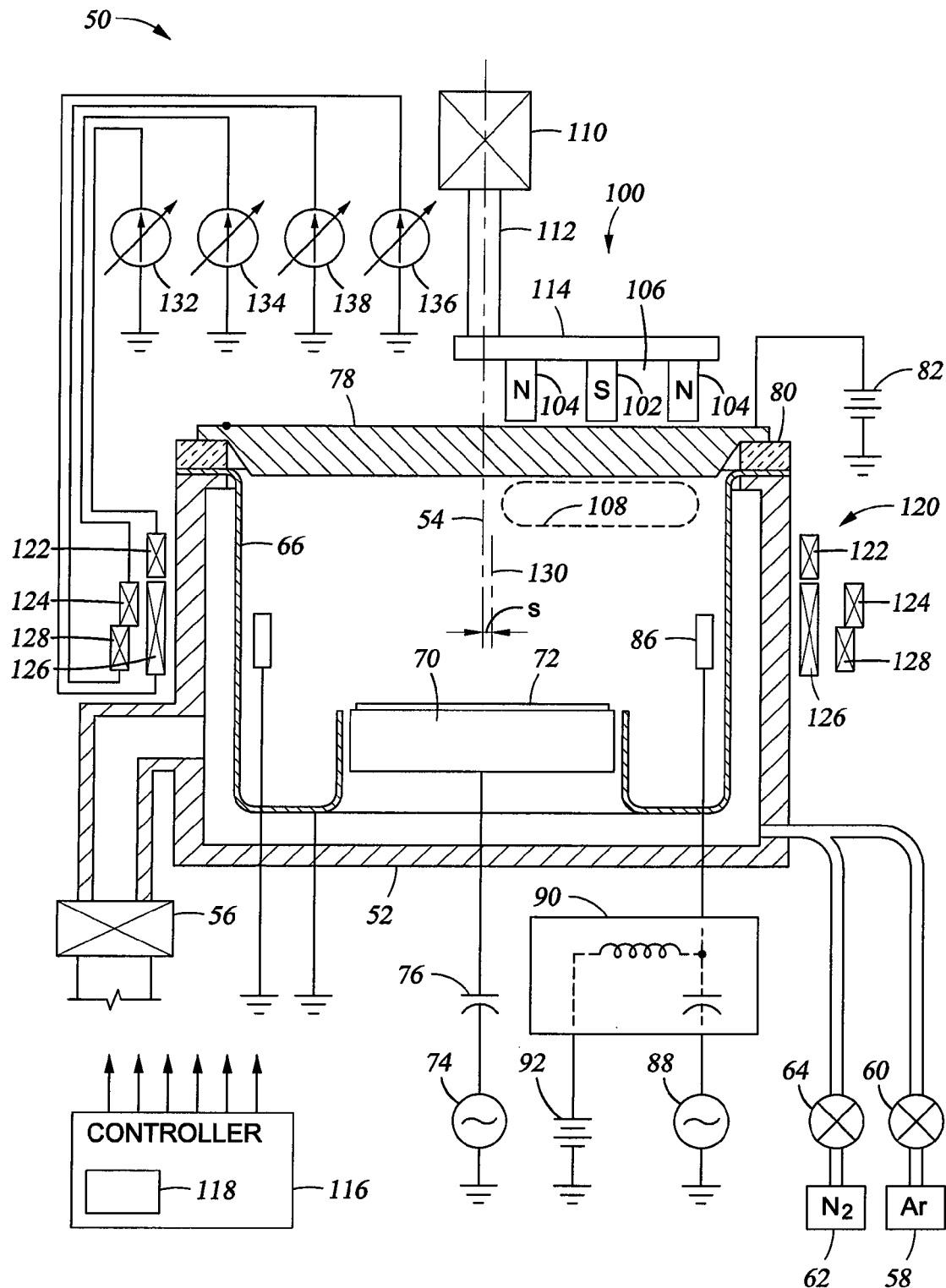
FIG. 5 is a schematic cross-sectional view of sputter chamber incorporating one embodiment of the invention.

The invention has been applied to a sputter chamber 50, schematically illustrated in the cross sectional view of FIG. 5, most of which Gung et al. have described in the previously cited patent application The sputter chamber 50 includes a vacuum chamber 52 arranged generally symmetrically about a central axis 54. A vacuum pump system 56 pumps the chamber 52 to a very low base pressure in the range of $10^{-6}$ Torr. However, a gas source 58 connected to the chamber 52 through a mass flow controller 60 supplies argon as a sputter working gas. The argon pressure inside the chamber 52 is typically held in the low milliTorr range. A second gas source 62 supplies nitrogen gas into the chamber through another mass flow controller 64 when metal nitride is being deposited. An electrically grounded shield 66 protects the chamber walls and the pedestal side from sputter deposition and provides an electrical anode for the plasma excitation process.

A pedestal 70 arranged about the central axis 54 holds a wafer 72 or other substrate to be sputter deposited and sputter etched. An unillustrated clamp ring or electrostatic chuck may be used to hold the wafer 72 to the pedestal 70. An RF power supply 74 is connected through a capacitive coupling circuit 76 to the pedestal 70, which is conductive and act as an electrode. In the presence of a plasma, the capacitively RF biased pedestal 70 develops a negative DC bias, which is effective at attracting and accelerating positive ions in the plasma. A target 78 is arranged in opposition to the pedestal 70 and is vacuum sealed to the chamber 52 through an isolator 80. At least the front surface of the target 78 is composed of a metallic material to be deposited on the wafer 70, for example, tantalum, ruthenium tantalum, or copper.

A DC power supply 82 electrically biases the target 78 to a negative voltage with respect to the grounded shield 66 to cause the argon to discharge into a plasma such that the positively charged argon ions are attracted to the negatively biased target 78 and sputter metal atoms from it, some of which fall upon the wafer 72 and deposit a layer of the metal target material on it. In reactive sputtering of tantalum, active nitrogen gas is additionally admitted from the nitrogen source 62 into the chamber 52 to react with the tantalum being sputtered to cause the deposition of a tantalum nitride layer on the wafer 72.

The sputter chamber 50 additionally includes an inductive coil 86, preferably having one wide turn wrapped around the central axis 54 just inside of the grounded shield 66 and positioned above the pedestal 70 approximately one-third of the distance to the target 78, that is, in the lower half of the processing space between the wafer 72 and target 78. The RF coil 86 is supported on the grounded shield 66 or another inner tubular shield but electrically isolated therefrom. Electrical leads penetrate the shield 66 and sidewalls of the chamber 52 to power the RF coil 86. Preferably, the RF coil 86 is composed of the same barrier material as the target 78. An RF power supply 88 applies RF current to the RF coil 86 through a DC/RF impedance matching circuit 90 to induce an axial RF magnetic field within the chamber 52 and hence generate an azimuthal RF electric field that is very effective at coupling power into the plasma and increasing its density. The inductively coupled RF power may be used as the primary plasma power source when the target power is turned off and the sputter chamber 50 is being used to etch the wafer 72 with argon ions or for other purposes. The inductively coupled RF power may alternatively act to increase the density of the plasma extending to the target 78. The RF coil 86 may be relatively wide and be composed of tantalum or copper to act as a secondary sputtering target under the proper conditions. A DC power supply 92 also applies a DC voltage to the inductive coil 86 through the DC/RF impedance matching circuit 90 so that the inductive coil 56 may additionally act to confine the plasma and guide the ions.

The target sputtering rate and sputter ionization fraction of the sputtered atoms can be greatly increased by placing a magnetron 100 in back of the target 78. The magnetron 100 preferably is small, strong, and unbalanced. The smallness and strength increase the ionization ratio and the imbalance projects a magnet field into the processing region for at least two effects of guiding sputtered ions to the wafer and reducing plasma loss to the walls. Such a magnetron 100 includes an inner pole 102 of one magnetic polarity along the central axis 54 and an outer pole 104 which surrounds the inner pole 102 and has the opposite magnetic polarity. A gap 106 of substantially constant width is formed between the poles 102, 104 in a closed loop. The magnetic field extending between the poles 102, 104 in front of the target 108 creates a high-density plasma region 108 adjacent the front face of the powered target 78, which greatly increases the sputtering rate. The closed-loop gap 106 defines a plasma track or loop in the high-density plasma region 108, thereby eliminating end loss. The magnetron 100 is unbalanced in the sense that the total magnetic intensity of the outer pole 104, that is, the magnetic flux integrated over its area, is substantially greater than that of the inner pole 102, for example, by a factor of two or more. The unbalanced magnetic field projects from the target 78 toward the wafer 72 to extend the plasma and to guide sputtered ions to the wafer 72 and reduce plasma diffusion to the sides. To provide a more uniform target sputtering pattern, the magnetron 100 may be formed in a triangular or racetrack shape that is asymmetrical about the central axis 54, but a motor 110 drives a rotary shaft 112 extending along the central axis 54 and fixed to a plate 114 supporting the magnetic poles 102, 104 to rotate the magnetron 100 about the central axis 54 and produce an azimuthally uniform time-averaged magnetic field. If the magnetic poles 102, 104 are formed by respective arrays of opposed cylindrical permanent magnets, the plate 114 is advantageously formed of a magnetic material such as magnetically soft stainless steel to serve as a magnetic yoke coupling the back sides of the two magnetic poles 102, 104 as well as mechanically supporting them.

A controller 116 contains a recordable data medium 118, such as a disk, which is loaded with a process recipe for achieving a desired structure in the wafer 72. The controller 116 accordingly controls the process control elements, for example, the vacuum system 56, the process gas mass flow controllers 60, 64, the wafer bias supply 74, the target power supply 82, the RF and DC coil supplies 88, 92, the magnetron motor 110 to control its rotation rate and hence the angular position of the magnetron 100, and the current supplies for an electromagnet array to be shortly described.

The sputter chamber 50 additionally includes a quadruple electromagnet array 120 positioned generally radially outwardly of the RF coil 86 on the exterior of the chamber 52. The quadruple electromagnet array 120 includes four solenoidal electromagnetic coils 122, 124, 126, 128 wrapped around the sidewalls of the vacuum chamber 72 and arranged in a two-dimensional array. The nomenclature is adopted of the top inner magnet (TIM) 122, top outer magnet (TOM) 124, bottom inner magnet (BIM) 126, and bottom outer magnet (BOM) 128. In this embodiment, the top and bottom outer magnets 124, 128 are placed radially outside of the bottom inner magnet 126. In the Gung et al. reference, all the coils are wrapped symmetrically about the central axis 54. However, in this embodiment of the present invention, only the top inner magnet 124, and the bottom inner and outer magnets 126, 128 are wrapped generally symmetrically about the central axis 54 while the top outer magnet 124 is wrapped about an offset axis 130 offset from the central axis 54 by a distance s. When opposing currents are passed through the bottom inner and outer magnet coils 126, 128, a magnetic field of the sort illustrated in FIG. 4 is produced but having azimuthally varying strength. The degree of variation depends upon the magnitude of coil separation s and the relative magnitudes of the currents in the two coils 126, 128. The azimuthal variation of the magnetic field produced by the two electromagnetic coils 126, 128 because of the symmetry offset between them may be tuned to reduce the azimuthal etch non-uniformity induced by the RF coil 86.

The design of the quadruple electromagnet array may be varied from that illustrated in FIG. 5. The non-axisymmetric coil may be located inwardly or outwardly an axisymmetric coil and may be located above or below a pair of axisymmetric coils. Additional coils may be incorporated to provide even greater process flexibility.

The electromagnetic coils 122, 124, 126, 128 may each be separately powered, for example, by respective variable DC power supplies 132, 134, 136, 138, which may be bipolar DC current supplies for the greatest flexibility. Corresponding unillustrated grounds or return paths are connected to the other ends of the multi-wrap coils 122, 124, 126, 128. However, in the most general case, not all coils 122, 124, 126, 128 need be connected to a common ground or other common potential. Other wiring patterns are possible. All coils 122, 124, 126, 128 have at least one and preferably two end connections that are readily accessible on the exterior of the assembled chamber to allow connection to separate power supplies or other current paths and to allow easy reconfiguration of these connections, thereby greatly increasing the flexibility of configuring the chamber during development or for different applications. In production, it is possible that the number of current supplies 132, 134, 136, 138 may be reduced but the capability remains to selectively and separately power the four different coils 122, 124, 126, 128 preferably with selected polarities, if the need arises as the process changes for the sputter chamber 50.

The sputter chamber 50 may be used in a multi-step sputter process of selectively coating target material, such as tantalum barrier layers and copper seed onto the sidewalls of high-aspect ratio via holes. In a first, sputter deposition step, the DC power supply 82 strongly biases the target 78 to create a sputtering plasma which sputters target material onto the wafer 72. For high-aspect ratio vias, a large fraction of the sputter atoms are ionized and the accelerated toward the wafer 70 by a high negative self-bias applied to the pedestal by the RF bias supply 74. The symmetric electromagnet coils 124, 126, 128 may be used to focus the ions towards the wafer 72 but little or no current is applied to the non-axisymmetric coil 124 so that the magnetic field applied by the sidewall magnets during the sputter deposition is substantially symmetric about the central axis 54. During one embodiment of the sputter deposition, little or no RF power is applied to the RF coil 86 by the RF coil supply 88. However, some types of sputter deposition concurrently effect sputter etching by powering the RF coil 86. In this case, the non-axisymmetric coil 124 may be used to compensate for RF asymmetry while the target 78 is being DC sputtered. Also during the sputter deposition, after the plasma has been ignited, depending upon the sputtering conditions and the material being sputtered, sustained self-sputtering may be achieved such that the sputter ions resputter the target 78 and little or no argon working gas needs to be supplied to the chamber. In one process embodiment, a sputter etching step follows the sputter deposition step. The target power is reduced and possibly zeroed. However, the RF coil supply 88 powers the RF coil 86 to excite an increased pressure of argon into a plasma. The argon ions are attracted to the wafer 70 by the negative self-bias induced by the RF bias supply 74 into the pedestal. The argon sputter etch is particularly effective on the bottom of high aspect-ratio vias and the planar field area on top of the wafer 72 but is less effective at etching the via sidewalls. During the sputter etch step, the asymmetric coil 124 is powered to produce an azimuthally asymmetric magnetic barrier, possibly in conjunction with the two symmetric bottom coils 126, 128.

The sputter chamber 50 may also be advantageously applied to a single step involving both sputter deposition with a DC powered target 78 and sputter etching with an RF powered coil 86. For example, the target sputtering may occur in the presence of a moderate pressure of argon so that the RF coil 86 creates an argon plasma closer to the wafer 72 than is the target plasma 108. The DC self-bias applied by the RF bias source to the pedestal 70 causes the argon ions to etch the wafer 72 at the same time that target atoms are being sputter deposited on the wafer 72. As a result, sputter deposition is being balanced against sputter etching. Further, the balance in different portions of the surface structure already developed in the wafer 72 depends on the relative number of neutrals and ions in the sputter flux so that selective deposition may be achieved.

Figure 6:
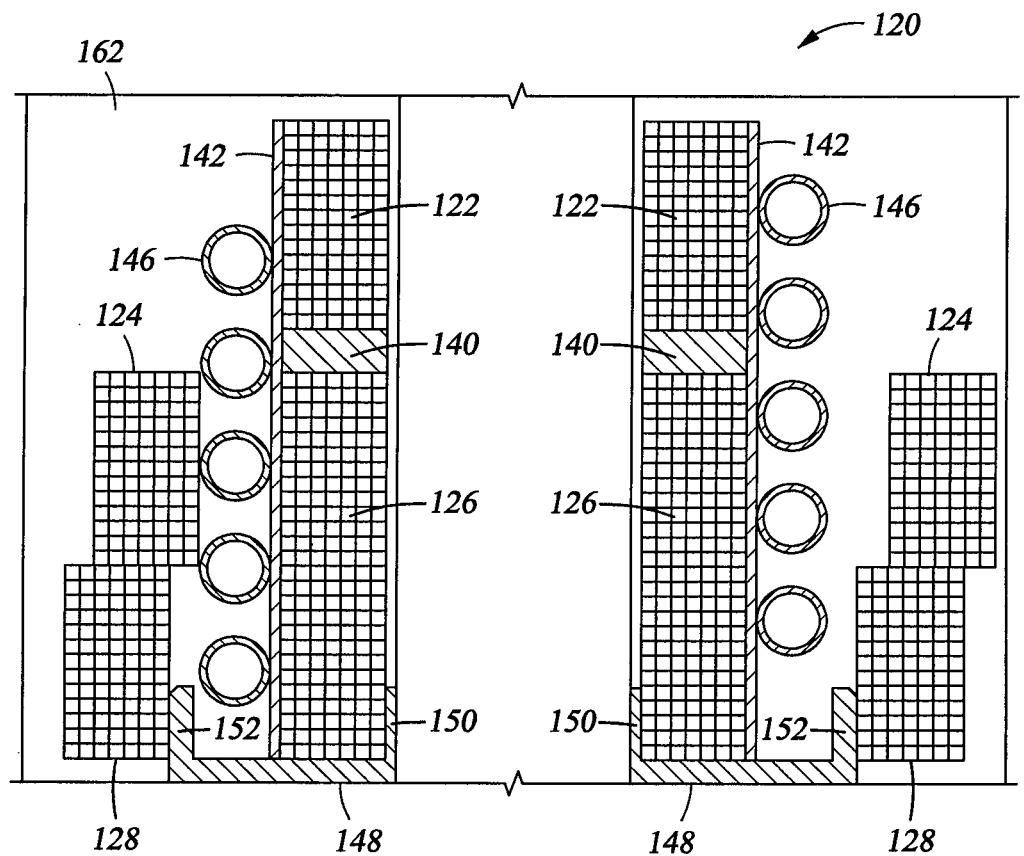
FIG. 6 is a cross-sectional view of two opposed portions of the electromagnet assembly of FIG. 5 and the middle portion is omitted.

The quadruple magnet array 120 is preferably fabricated as an encapsulated assembly including internal water cooling by adapting the description for fabricating an axisymmetric array by Gillard et al. in U.S. patent application Ser. No. 11/610,075, filed Dec. 13, 2006 and incorporated herein by reference. However, the offset magnet coil included within the present invention requires some changes in the structure and fabrication technique. The cross-sectional view of FIG. 6 illustrates the two opposed portions of the annular electromagnet array 120 having respectively minimum and maximum radial separation of the bottom inner coil 126 and the top outer coil 124. The top and bottom inner magnet coils 122 are wound together on a mandrel from square insulatively coated magnet wires with a washer-shaped non-magnetic spacer 140 between them. The top and bottom inner magnet coils 122 are axisymmetric with respect to the rotation axis of the mandrel and to the chamber central axis 54 with which the quadruple magnet array 120 may be used. Epoxy is painted on the wires during winding to bind them together. An annular aluminum shim 142 is placed around the wound inner coils 122, 126. A pre-wound stainless steel hollow cooling coil 146 for cooling water is placed around the shim 142 and tightened against it. The outer magnet coils 124, 128 are similarly wound on another mandrel having an axisymmetric surface area over which the axisymmetric bottom outer magnet coil 126 is wound but an axially offset eccentric surface area over which the eccentric top outer magnet coil 124 is wound such that the top outer magnet coil 124 will be non-axisymmetric or eccentric with respect to the chamber central axis 54 while the bottom inner magnet coil 128 will be axisymmetric with respect to the central axis 54. The eccentricity determines the offset s in the separation between the bottom inner coil 126 and top outer coil 124. One range for the offset s is between 2 and 20 mm, which should be compared to a 300 mm wafer. In one implementation, the offsets is set at 0.150 inch (3.8 mm), the number of magnet wire turns in the top inner coil 122 is 7×14, in the top and bottom outer coils 124, 128 is 7×13, and in the bottom inner coil 126 is 7×26 respectively. The epoxy used in winding binds the two outer magnet coils 124, 128 together in an outer coil assembly.

Figure 7:
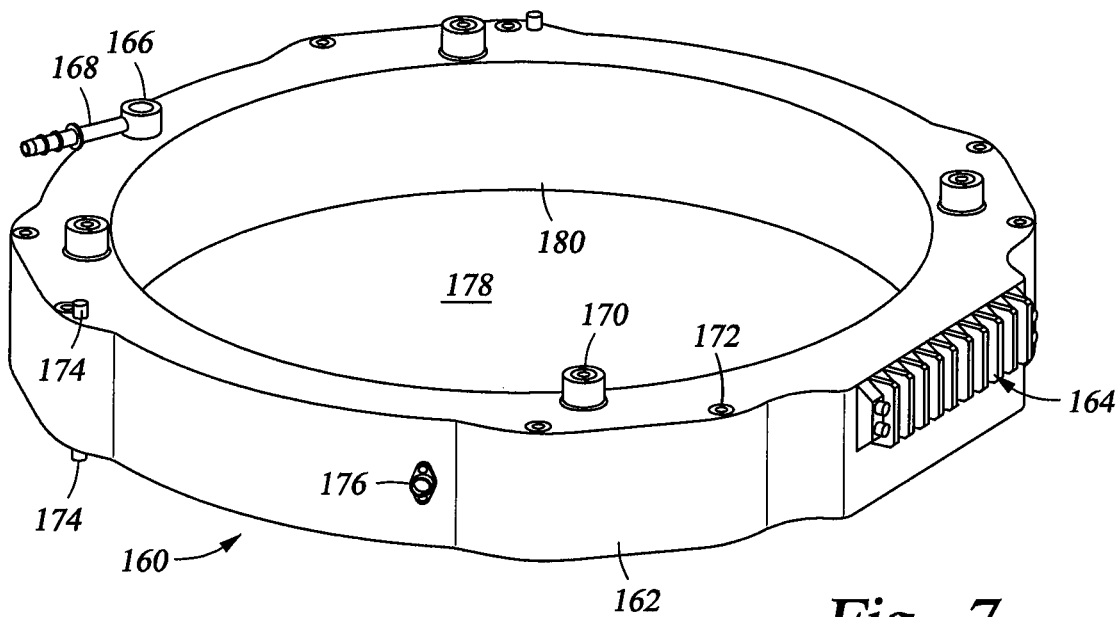
FIG. 7 is an orthographic view of a encapsulated unitary electromagnet assembly of FIG. 6.

An inner coil assembly of the inner magnet coils 122, 126, shim 142, and cooling coil 146 is placed in an annular trough-shaped plastic (G10) holder 148 against the inside of an ascending annular inner wall 150 of the holder 148. The outer coil assembly of the outer magnet coils 124, 128 is placed around the inner coil assembly with the axisymmetric lower inner coil 128 aligned to an ascending annular outer wall 152 of the holder 148 with one side of the eccentric upper magnet coil 124 contacting or nearly contacting the cooling coil 146. The parts are then placed into a mold, which is then filled with a curable epoxy resin of high thermal conductivity to form an encapsulated magnet array assembly 160, illustrated in the orthographic view of FIG. 7, in which the magnet and cooling coils are encased in a rigid encapsulant 162 of the cured epoxy resin. Additionally, the final magnet array assembly may include a nine-position terminal block 164 having additional terminals for external electrical connections is screwed to the encapsulation after curing. The eight ends of the magnet wires of the electromagnetic coils protrude from the encapsulant 162 and are connected to the terminal block 164. The ninth position grounds the cooling coil 142. Corresponding other terminals electrically are connected to the first nine positions on the terminal block 164 for either external connection or cross connection. Two water fittings 166 are welded to the opposite ends of the cooling coil 146 and extend axially above and below the encapsulant 162. Barbs 168 can be screwed into the water fittings 166 after encapsulation to accept flexible water tubing for the supply and return of the cooling water. Four lifting brackets 170 are positioned above the encapsulated magnet array 160 and have central posts extending downwardly in the vicinity of the shim 142 to more directly support the magnet coils when the encapsulated magnet array 160 is being moved to and from the sputter chamber. The upper end of the lifting brackets 170 include internal threads to which a hoist lifting mechanism may be detachably fitted. Eight pass through tubes 172 are positioned around the periphery of the electromagnet assembly 160 and have vertical pass through holes for bolts securing different levels of the chamber assembly. Pairs of locating pins 174 are located on the upper and lower surfaces of the electromagnet assembly 160 to fit with corresponding holes in the chamber levels above and below. A thermal switch 176 is mounted on the side of the electromagnet assembly 160 close to the electromagnetic coils. If the monitored temperature exceeds a predetermined shut down temperature, for example, 66° C., the electromagnet power supplies 132, 134, 136, 138 are shut down as part of a chamber interrupt.

The encapsulant 162 is molded to have a central bore 178 inside of a cylindrical sidewall 180 sized such that the electromagnet assembly 160 can be slid over the exterior of a two-part adapter forming part of the vacuum chamber 52. The dimensions of the electromagnet assembly 160 are substantially identical to that of the axisymmetric electromagnet assembly of Gillard et al. so that the two can be interchanged in the field.

Figure 8:
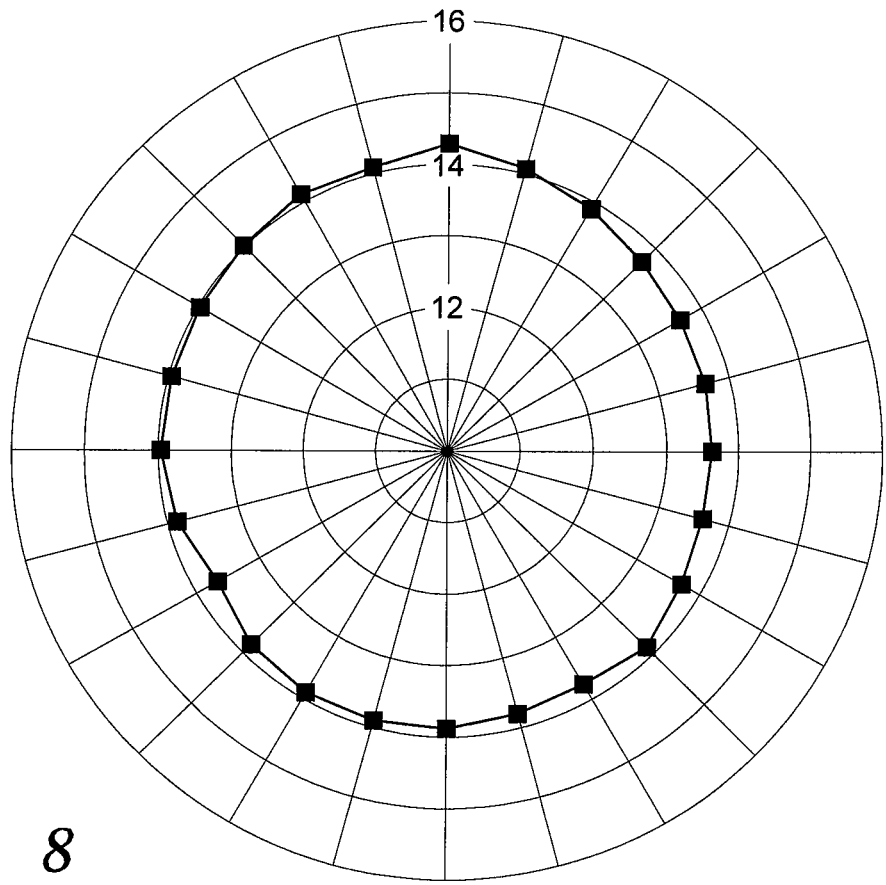
FIG. 8 is a graph illustrating the azimuthal etch asymmetry observed with a non-axisymmetric electromagnet assembly of the invention.

The many variables present with the non-axisymmetric magnet array of the invention allow finely tuned optimization capable of substantially reducing azimuthal asymmetry. The graph of FIG. 8 illustrates the results of one optimized use of the invention, which shows a significantly reduced azimuthal asymmetry over the asymmetry of FIG. 2.

The electromagnet assembly illustrated in detail in FIG. 6 enjoys many benefits. The top inner magnet 122 can be used alone to create a simple solenoidal field, which is useful in guiding sputtered ions during the sputter deposition mode. The axisymmetric inner magnets 122, 126 may be tuned against each other to control the magnetic field gradient near the target 78 or wafer 72. Any or all of the magnets 122, 124, 126, 128 can be used in combination during the sputter etch mode to both confine the plasma and guide the argon ions. The combination of the non-axisymmetric bottom inner magnet 126 and the axisymmetric bottom outer magnet 128 in back of it can produce the axisymmetric magnetic field distribution of FIG. 4 which quickly attenuates inside the sputter chamber. However, the non-axisymmetric bottom inner magnet 126 may be used in combination with any or all of the axisymmetric magnets 122, 126, 128. On the other hand, the combination of the bottom inner magnet 126 and non-axisymmetric top magnet 124 in back of it can produce a non-axisymmetric magnetic field distribution which can compensate for azimuthal asymmetries in the plasma. Both combinations can be used simultaneously to produce a desired degree of azimuthal asymmetry. In the simplest use, the current turns in the bottom inner electromagnet 126 equals the negative of the sum of the current turns in the top and bottom outer electromagnets 124, 128. Preferably the total number of amp turns, taking into account the directions of the currents in all the coils, should be approximately zero to reduce interference with other chambers.

Although in the described embodiment the azimuthal asymmetry of the non-axisymmetric electromagnet was aligned with the junction of the RF coil, it is recognized that the azimuthal compensation of the plasma may be optimized with other angular alignments. It is further possible to rotate the asymmetric electromagnet assembly to optimize the azimuthal compensation.

The design of the electromagnet assembly of FIG. 6 was constrained by the desire to replicate the external form factor and external wiring of the symmetric electromagnet assembly of Gillard et al. Other designs are possible. For example, a single non-axisymmetric coil unpaired with a symmetric coil can provide sufficient azimuthal asymmetry in the magnetic field to compensate for plasma non-uniformities.

Figure 9:
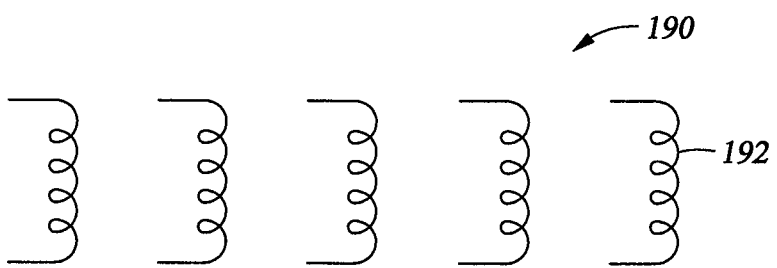
FIG. 9 is a schematic illustration of an alternative magnet assembly using a solenoid array.
Figure 10:
FIG. 10 is a schematic illustration of another alternative magnet assembly using a permanent magnet array.

Alternative means exist for creating an non-axisymmetric magnetic field. As schematically illustrated in FIG. 9, an annular solenoid array 190 of vertically oriented solenoids 192 may be arranged in an angularly spaced array around the chamber sidewalls. The solenoid array 190 may be arranged symmetrically about the offset axis 130, in which case the solenoids may be commonly powered and nonetheless produce an eccentric magnetic field distribution. Alternatively and preferably, the solenoid array 190 may be arranged symmetrically about the chamber central axis 54 and be independently powered so as to enable the production of a nearly arbitrary magnetic field distribution. However, the projection of the magnetic field from such solenoids 192 into the sputter chamber 52 scales with the interior bore of the solenoids 192 with the result that they are less effective than electromagnetic coils wrapped around the chamber sidewalls. Alternatively, as schematically illustrated in FIG. 10, a magnet array 194 of permanent magnets 196 polarized in one of the directions along the chamber central axis 54 may be arranged around the chamber sidewalls. If they are arranged at regular angular spacings symmetrically about the offset axis 130, they create an eccentric magnetic field. Alternatively, they may be symmetrically about the chamber central axis 54 but have irregular angular spacings to create the non-axisymmetric magnetic field. Although permanent magnets are effective at creating such auxiliary fields, they suffer from their inability to be switched on and off between the sputter deposition and etching modes or to be easily optimized for different processes.

Although the invention has been described with particular reference to barrier layers of, for example, tantalum, it may be applied to the sputter deposition and resputtering of other metal. Although the invention is particularly useful in a sputter chamber having an RF coil to promote sputter etching of the substrate, non-axisymmetric electromagnets may be applied to other plasma chambers to compensate for azimuthal non-uniformities. It is particularly applicable to plasma processing chambers including RF coils including chambers for PVD, CVD, pre-cleaning and etching.

The invention thus provides improved uniformity with a simple change in existing hardware that may be changed in the field.

The invention claimed is:

1. A plasma processing chamber, comprising:
   a vacuum chamber arranged about a central axis;
   a pedestal for supporting a substrate in a first plane perpendicular to the central axis adjacent a processing space in the vacuum chamber;
   a non-axisymmetric electromagnet coil symmetrically wound about an offset axis offset from the central axis by a predetermined and fixed offset and extending about the offset axis along a second plane around the processing space;
   a DC power supply providing continuous DC power to the non-axisymmetric electromagnet coil; and
   a single-turn RF inductive coil wound about the central axis and having a pair of junctions for connection to an RF power supply and to ground, wherein the predetermined and fixed offset is aligned along a direction from the pair of junctions to the central axis.

2. The chamber of claim 1, wherein the inductive coil extends along the second plane.

3. A plasma sputtering chamber, comprising:
   a vacuum chamber arranged about a central axis;
   a sputter target disposed on a side of the vacuum chamber and arranged about the central axis;
   a magnetron positioned in back of the sputter target and rotatable about the central axis;
   a pedestal for supporting a substrate in opposition to the sputter target in a pedestal plane extending perpendicularly to the central axis adjacent a processing space in the vacuum chamber;
   a non-axisymmetric electromagnet coil wound about an offset axis offset from the central axis by a predetermined offset and extending about the offset axis within a coil plane perpendicular to the central axis; and
   a first axisymmetric electromagnet coil wound about the central axis in the coil plane.

4. The chamber of claim 3, wherein the first axisymmetric electromagnet coil is disposed closer to the central axis than is the non-axisymmetric electromagnet coil.

5. The chamber of claim 3, further comprising:
   a second axisymmetric electromagnet coil wound about the central axis at a different axial height from the pedestal than the first axisymmetric electromagnet coil.

6. A method of sputtering processing the substrate in the plasma processing chamber of claim 1 additionally having a target disposed in opposition along the central axis to the pedestal, wherein the non-axisymmetric electromagnet coil is disposed radially outwardly of the RF coil, comprising the steps of:
   a first process step of applying DC power to the target to create a sputtering plasma adjacent the target to sputter atoms from the target onto the substrate; and
   a second process step including
     introducing argon into chamber
     reducing the amount of DC power applied to the target,
     increasing an amount of RF power applied to the RF coil to create an etching plasma including argon ions,
     biasing the pedestal to attract the argon ions, and
     applying a level of DC current to the non-axisymmetric electromagnet coil greater than in the first process step.

7. The method of claim 6, wherein the direction of offset and the level of DC current are chosen to compensate for azimuthal asymmetry in the etching plasma.

8. The method of claim 6, wherein the chamber includes at least one axisymmetric electromagnet coil wrapped around the central axis and wherein during the first process step the current is supplied to the at least one axisymmetric coil to create a magnetic field symmetric about the central axis.

9. The method of claim 6, wherein the target comprises at least one of tantalum and ruthenium.

10. A method of sputter processing the substrate in the plasma processing chamber of claim 1 additionally having a target disposed in opposition along the central axis to the pedestal, wherein the a non-axisymmetric electromagnet coil is disposed radially outwardly of the RF coil, comprising:
    introducing argon into the chamber;
    biasing the pedestal;

applying DC power to the target to create a sputtering plasma adjacent the target to sputter atoms from the target onto the substrate;

applying RF power to the RF coil to excite the argon into an argon plasma to sputter etch the wafer; and applying DC current to the non-axisymmetric electromagnet coil to compensate for azimuthal asymmetry introduced in the argon plasma by the RF coil.

11. The method of claim 10, further comprising applying DC current of polarity opposite that in the non-axisymmetric electromagnet coil to an axisymmetric electromagnet coil disposed in a same plane as the non-axisymmetric coil.

12. The method of claim 10, wherein the target comprises at least one of ruthenium and tantalum.

13. The chamber of claim 1, wherein the vacuum chamber is configured to be fit with a sputtering target arranged about the central axis in opposition to the pedestal and with the processing space being formed between the sputtering target and the pedestal.

14. The plasma processing chamber of claim 1, wherein the single-turn RF inductive coil produces an RF magnetic field and wherein a DC magnetic field produced by the non-axisymmetric electromagnet coil compensates for an azimuthal asymmetry in a plasma induced by the RF magnetic field.

15. The chamber of claim 1, wherein the non-axisymmetric electromagnet coil is encapsulated in an assembly which includes at least one mechanical fixing element locating and fixing the assembly on at least one corresponding element of the vacuum chamber.

16. The chamber of claim 3, further comprising at least one DC power supply coupled to the axisymmetric electromagnetic coil and to the non-axisymmetric electromagnet coil.

* * * * *